(12) United States Patent
Leeflang et al.

(10) Patent No.: US 10,767,463 B2
(45) Date of Patent: *Sep. 8, 2020

(54) DOWNHOLE DISTRIBUTED PRESSURE SENSOR ARRAYS, PRESSURE SENSORS, DOWNHOLE DISTRIBUTED PRESSURE SENSOR ARRAYS INCLUDING QUARTZ RESONATOR SENSORS, AND RELATED METHODS

(71) Applicant: Quartzdyne, Inc., Salt Lake City, UT (US)

(72) Inventors: Brian T. Leeflang, Salt Lake City, UT (US); G. Scott Brown, Eagle Mountain, UT (US)

(73) Assignee: Quartzdyne, Inc., Salt Lake City, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/195,420

(22) Filed: Nov. 19, 2018

(65) Prior Publication Data

US 2019/0309616 A1 Oct. 10, 2019

Related U.S. Application Data

(63) Continuation of application No. 14/923,943, filed on Oct. 27, 2015, now Pat. No. 10,132,156.

(Continued)

(51) Int. Cl.
*E21B 47/017* (2012.01)
*E21B 47/06* (2012.01)

(Continued)

(52) U.S. Cl.
CPC ............ *E21B 47/017* (2020.05); *E21B 47/06* (2013.01); *G01L 9/085* (2013.01); *G01L 11/04* (2013.01); *H03H 9/19* (2013.01)

(58) Field of Classification Search
CPC ........ E21B 47/011; E21B 47/06; G01L 9/085; G01L 11/04; H03H 9/19
See application file for complete search history.

(56) References Cited

U.S. PATENT DOCUMENTS

| | | |
|---|---|---|
| 3,561,832 A | 2/1971 | Karrer et al. |
| 3,617,780 A | 11/1971 | Benjaminson et al. |

(Continued)

FOREIGN PATENT DOCUMENTS

| | | |
|---|---|---|
| CA | 2467313 A1 | 11/2004 |
| CA | 2591619 A1 | 11/2004 |

(Continued)

OTHER PUBLICATIONS

Brown et al., U.S. Provisional Patent Application to Brown et al., filed on Nov. 3, 2014., U.S. Appl. No. 62/074,517.

(Continued)

*Primary Examiner* — Randy W Gibson
*Assistant Examiner* — Gedeon M Kidanu
(74) *Attorney, Agent, or Firm* — Phillips Winchester; Gregory C. Baker (57) ABSTRACT

Downhole distributed pressure sensor arrays include sensor housings each comprising at least one pressure sensor in a pressure housing. Downhole pressure sensors include a housing, at least one pressure sensor in a pressure housing portion of the housing, and at least one isolation element positioned at an outer wall of the housing.

19 Claims, 6 Drawing Sheets

Related U.S. Application Data (60) Provisional application No. 62/074,510, filed on Nov. 3, 2014.

(51) Int. Cl.
*H03H 9/19* (2006.01)
*G01L 11/04* (2006.01)
*G01L 9/08* (2006.01)

(56) References Cited

U.S. PATENT DOCUMENTS

| | | | |
|---|---|---|---|
| 4,550,610 A | 11/1985 | EerNisse | |
| 4,629,888 A | 12/1986 | Wolk | |
| 4,754,646 A * | 7/1988 | EerNisse | G01L 9/0022 310/338 |
| 5,231,880 A | 8/1993 | Ward et al. | |
| 5,303,773 A | 4/1994 | Czernichow et al. | |
| 5,471,882 A | 12/1995 | Wiggins | |
| 6,009,216 A | 12/1999 | Pruett et al. | |
| 6,131,462 A | 10/2000 | EerNisse et al. | |
| 6,886,638 B2 | 5/2005 | Ahmed et al. | |
| 6,888,972 B2 | 5/2005 | Berg et al. | |
| 6,919,512 B2 | 7/2005 | Guven et al. | |
| 6,966,228 B2 | 11/2005 | Binet et al. | |
| 7,216,719 B2 | 5/2007 | Ahmed et al. | |
| 7,340,819 B2 | 3/2008 | Guven et al. | |
| 7,712,524 B2 | 5/2010 | Patel et al. | |
| 7,735,555 B2 | 6/2010 | Patel et al. | |
| 7,775,275 B2 | 8/2010 | Patel | |
| 7,793,718 B2 | 9/2010 | Patel et al. | |
| 7,817,062 B1 | 10/2010 | Li et al. | |
| 7,836,959 B2 | 11/2010 | Howard et al. | |
| 7,890,273 B2 | 2/2011 | Lovell et al. | |
| 7,896,070 B2 | 3/2011 | Lovell | |
| 7,913,773 B2 | 3/2011 | Li et al. | |
| 8,028,571 B2 | 10/2011 | Besson | |
| 8,056,619 B2 | 11/2011 | Patel et al. | |
| 8,082,983 B2 | 12/2011 | Patel et al. | |
| 8,082,990 B2 | 12/2011 | Lovell et al. | |
| 8,146,658 B2 * | 4/2012 | Howard | E21B 17/028 166/250.11 |
| 8,195,398 B2 | 6/2012 | Lovell et al. | |
| 8,235,127 B2 | 8/2012 | Patel et al. | |
| 8,312,923 B2 | 11/2012 | Patel et al. | |
| 8,333,117 B2 | 12/2012 | Brown et al. | |
| 8,548,743 B2 | 10/2013 | Lovell | |
| 8,671,749 B2 * | 3/2014 | Zeineddine | G01L 1/26 73/152.51 |
| 8,757,276 B2 | 6/2014 | Alff et al. | |
| 9,540,917 B2 | 1/2017 | Stone et al. | |
| 2005/0279442 A1 | 12/2005 | Guven et al. | |
| 2007/0030167 A1 | 2/2007 | Li et al. | |
| 2007/0227727 A1 | 10/2007 | Patel et al. | |
| 2007/0289779 A1 * | 12/2007 | Howard | E21B 43/14 175/40 |
| 2009/0151935 A1 | 6/2009 | Lovell et al. | |
| 2009/0173493 A1 | 7/2009 | Hutin et al. | |
| 2010/0116550 A1 | 5/2010 | Hutin et al. | |
| 2010/0200291 A1 | 8/2010 | Patel et al. | |
| 2011/0107834 A1 | 5/2011 | Howard et al. | |
| 2011/0191031 A1 | 8/2011 | Harman et al. | |
| 2011/0229071 A1 | 9/2011 | Vincelette et al. | |
| 2012/0013482 A1 | 1/2012 | Patel et al. | |
| 2012/0198939 A1 * | 8/2012 | Brown | G01L 9/0044 73/715 |
| 2012/0306581 A1 * | 12/2012 | Godager | G01L 9/0022 331/56 |
| 2012/0323494 A1 | 12/2012 | Lovell et al. | |
| 2012/0325010 A1 * | 12/2012 | Zeineddine | E21B 47/017 73/855 |
| 2013/0220029 A1 * | 8/2013 | Gardner | G01L 1/00 73/862.52 |
| 2014/0174714 A1 | 6/2014 | Patel et al. | |
| 2014/0278155 A1 | 9/2014 | EerNisse et al. | |
| 2015/0007650 A1 | 1/2015 | Rose et al. | |
| 2015/0059483 A1 | 3/2015 | Puccio et al. | |

FOREIGN PATENT DOCUMENTS

| | | |
|---|---|---|
| CA | 2724709 A1 | 11/2004 |
| CA | 2492608 C | 5/2009 |
| EP | 1915504 B1 | 6/2010 |
| GB | 2382474 B | 12/2003 |
| GB | 2412340 A | 9/2005 |
| GB | 2402559 B | 11/2005 |
| WO | 2008/060769 A2 | 5/2008 |
| WO | 2010/025025 A1 | 3/2010 |
| WO | 2011/006083 A1 | 1/2011 |

OTHER PUBLICATIONS

ICTA. International Coiled Tubing Association presents an Introduction to Coiled Tubing History, Applications and Benefits, www.icota.com, (2005), 32 pages.

* cited by examiner

DOWNHOLE DISTRIBUTED PRESSURE SENSOR ARRAYS, PRESSURE SENSORS, DOWNHOLE DISTRIBUTED PRESSURE SENSOR ARRAYS INCLUDING QUARTZ RESONATOR SENSORS, AND RELATED METHODS

CROSS-REFERENCE TO RELATED APPLICATIONS

This application is a continuation of U.S. patent application Ser. No. 14/923,943, filed Oct. 27, 2015, which will issue as U.S. Pat. No. 10,132,156 on Nov. 20, 2018, which claims the benefit of U.S. Provisional Patent Application Ser. No. 62/074,510, filed Nov. 3, 2014, the disclosure of each of which is hereby incorporated herein in its entirety by this reference.

The subject matter of this application is related to U.S. patent application Ser. No. 14/923,756, filed Oct. 27, 2015, pending.

TECHNICAL FIELD

Embodiments of the present disclosure relate to sensors for measurement of one or more of pressure and temperature in a subterranean wellbore and, more particularly, to distributed arrays of such sensors, pressure sensors, related assemblies, and associated methods.

BACKGROUND

In some applications, e.g., oil and gas production, it may be desirable to collect data from along a particular interval (e.g., length, depth) of a wellbore to obtain information regarding pressure and/or temperature gradients within the wellbore by employing a number of sensors to measure pressure and/or temperature sensors distributed in an array extending substantially along the wellbore interval. When implemented in a downhole environment, the sensors and/or housings may be exposed to pressures up to about 30,000 psi (about 206.84 MPa) and temperatures of up to 200° C. Accordingly, housings of such sensors must be sufficiently robust to withstand such pressures and temperatures when in use.

In many conventional sensor arrays, optical fibers may be used as temperature and/or pressure sensors of the sensor array. In such a temperature and pressure sensing approach, optical fibers are implemented as linear sensors where temperature and/or pressure affects the light transmission in the optical fibers to create a continuous temperature and/or pressure profile of the downhole environment. However, optical fibers may fail to correctly transmit data if the fibers are bent (e.g., kinked) to a radius of curvature smaller than a certain fixed value, such value depending upon the fiber characteristics.

Furthermore, optical fibers may be relatively fragile and prone to failure under conditions where the fibers are subject to shock and vibration. Moreover, as the housings of such sensor arrays must withstand the extreme downhole conditions described above, particularly extreme pressures for prolonged time periods, methods of bonding individual constituent components of the sensor array must provide a sufficiently robust connection between the components to isolate and protect the fragile optical fibers. However, implementation of component bonding methods such as welding, which may provide a robust connection between components, may expose sensitive components of the sensor array to excessive, and potentially damaging, heat required by the welding process.

Further still, in situations where such arrays are implemented as arrays of pressure sensors, it may be required to at least partially expose the pressure sensors in the array to the pressure of the external environment (e.g., via a fluid within the sensor). Electrical conductors connecting each sensor of the array must be passed along the array past each pressure sensor. Thus, passing the electrical conductors past each pressure sensor may be difficult as such electrical conductors must be routed through or around portions of each sensor having housings that are equipped to handle the forces from pressures and temperatures of a downhole environment.

BRIEF SUMMARY

In some embodiments, a downhole distributed pressure sensor array includes sensor housings, at least one sensor housing of the sensor housings comprising at least one pressure sensor disposed in a pressure housing for detecting a pressure of an environment external to the at least one sensor housing, cable segments connecting the sensor housings, and at least one electrical conductor extending through at least one cable segment of the cable segments and connecting the at least one sensor housing to an adjacent sensor housing of the sensor housings. A portion of the at least one electrical conductor passes within the at least one sensor housing around the pressure housing of the at least one sensor housing.

In additional embodiments, a downhole distributed pressure sensor array includes sensor housings each having a longitudinal axis and electrical conductors extending through cable segments between adjacent sensor housings and connecting each sensor housing of the sensor housings to an adjacent sensor housing. Each sensor housing comprises at least one pressure sensor, at least one chamber in the sensor housing holding a substantially incompressible fluid and in communication with the at least one pressure sensor, the at least one chamber in communication with a sidewall of the sensor housing in a direction transverse to the longitudinal axis of the sensor housing, and at least one diaphragm coupled to the sensor housing in communication with the at least one chamber and positioned at and defining a portion of the sidewall of the sensor housing.

In yet additional embodiments, a downhole pressure sensor includes at least one pressure sensor and a housing having a longitudinal axis. The housing includes at least one chamber in a pressure housing portion of the housing holding the at least one pressure sensor and holding a substantially incompressible fluid, where the at least one chamber extends through at least one portion of an outer wall of the housing and at least one isolation element coupled to the pressure housing portion of the housing in communication with the at least one chamber and positioned at the outer wall of the housing.

In yet additional embodiments, a downhole pressure sensor includes sensor housings, cable segments connecting the sensor housings, and electrical conductors extending through the cable segments and connecting each sensor housing of the sensor housings to an adjacent sensor housing. Each sensor housing comprises at least one quartz resonator pressure sensor disposed in a pressure housing for detecting a pressure of an environment external to the sensor housing.

In yet additional embodiments, the present disclosure includes sensors and related assemblies and methods of forming and operating sensors and related assemblies as described below.

BRIEF DESCRIPTION OF THE DRAWINGS

While the specification concludes with claims particularly pointing out and distinctly claiming what are regarded as embodiments of the present disclosure, various features and advantages of embodiments of the disclosure may be more readily ascertained from the following description of example embodiments of the disclosure provided with reference to the accompanying drawings, in which:

DETAILED DESCRIPTION

In the following detailed description, reference is made to the accompanying drawings that depict, by way of illustration, specific embodiments in which the disclosure may be practiced. However, other embodiments may be utilized, and structural, logical, and configurational changes may be made without departing from the scope of the disclosure. The illustrations presented herein are not meant to be actual views of any particular sensor, sensor array, assembly, or component thereof, but are merely idealized representations that are employed to describe embodiments of the present disclosure. The drawings presented herein are not necessarily drawn to scale. Additionally, elements common between drawings may retain the same numerical designation.

Although some embodiments of sensors of the present disclosure are depicted as being used and employed as pressure sensors utilizing one or more quartz resonator sensors, persons of ordinary skill in the art will understand that the embodiments of the present disclosure may be employed in any assembly or system for measurement of various conditions in an environment.

Figure 1:
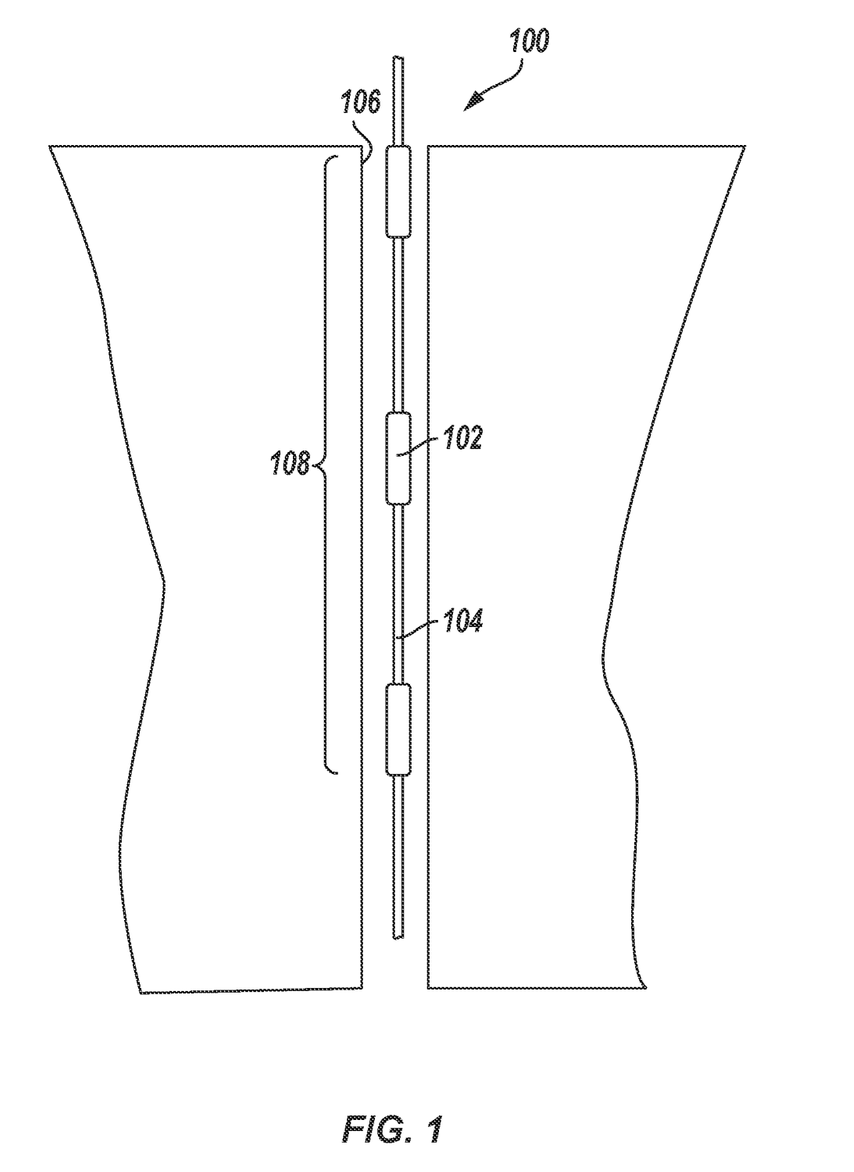
FIG. 1 is a simplified schematic elevation view of a sensor array in accordance with an embodiment of the present disclosure deployed in a wellbore.

Referring now to FIG. 1, a sensor array 100 (e.g., a distributed pressure sensor array) according to the disclosure includes sensors 102 (e.g., transducers) interconnected by lengths of cable 104. The sensor array 100 may include any suitable number of sensors 102 (e.g., pressure sensors) distributed along a cable 104. For example, in some embodiments of the disclosure, the sensor array 100 may include between ten and one hundred mutually longitudinally spaced sensors 102. The sensors 102 may each be configured to detect one or more of pressure and temperature. For example, some or all of the sensors 102 in the sensor array 100 may each be configured to, either automatically and periodically, or in response to a signal transmitted through cable 104, at least substantially simultaneously (e.g., at substantially the same time, in the same time interval) detect one or more of pressure and temperature in wellbore and relay those sensed values such that a continuous profile of conditions and changes in conditions in the wellbore relating to such sensed values may be provided to an operator monitoring wellbore conditions.

The sensor array 100 may be deployed within a wellbore 106, e.g., a well for the production of oil and/or natural gas, or geothermal energy. Each sensor 102 of the sensor array 100 may be used to collect data related to one or more of pressure and temperature at a particular location within the wellbore 106. For example, each sensor 102 of the sensor array 100 may collect data relating to conditions within a string of tubular components (e.g., a production string) positioned in the wellbore 106, data relating to conditions in an annulus between the production string in the wellbore 106 and the wellbore 106 itself, or combinations thereof. For example, the sensor array 100 may be positioned outside of the production string in the wellbore annulus between the string and a casing or liner string adjacent the wall of the wellbore. In some embodiments, the sensor array 100 may be placed in direct communication with the interior of the production string in the wellbore. For example, the sensor array 100 may be coupled to the outside of the production string and one or more apertures in the production string may place the sensor array 100 in communication with the interior of the production string (e.g., in direct communication with pressure and/or temperature inside the production string via the apertures). Data from each individual sensor 102 may be combined to provide information about a pressure and/or temperature profile within the wellbore 106 along a length 108 of the wellbore 106 along which the sensor array 100 is deployed.

Figure 2:
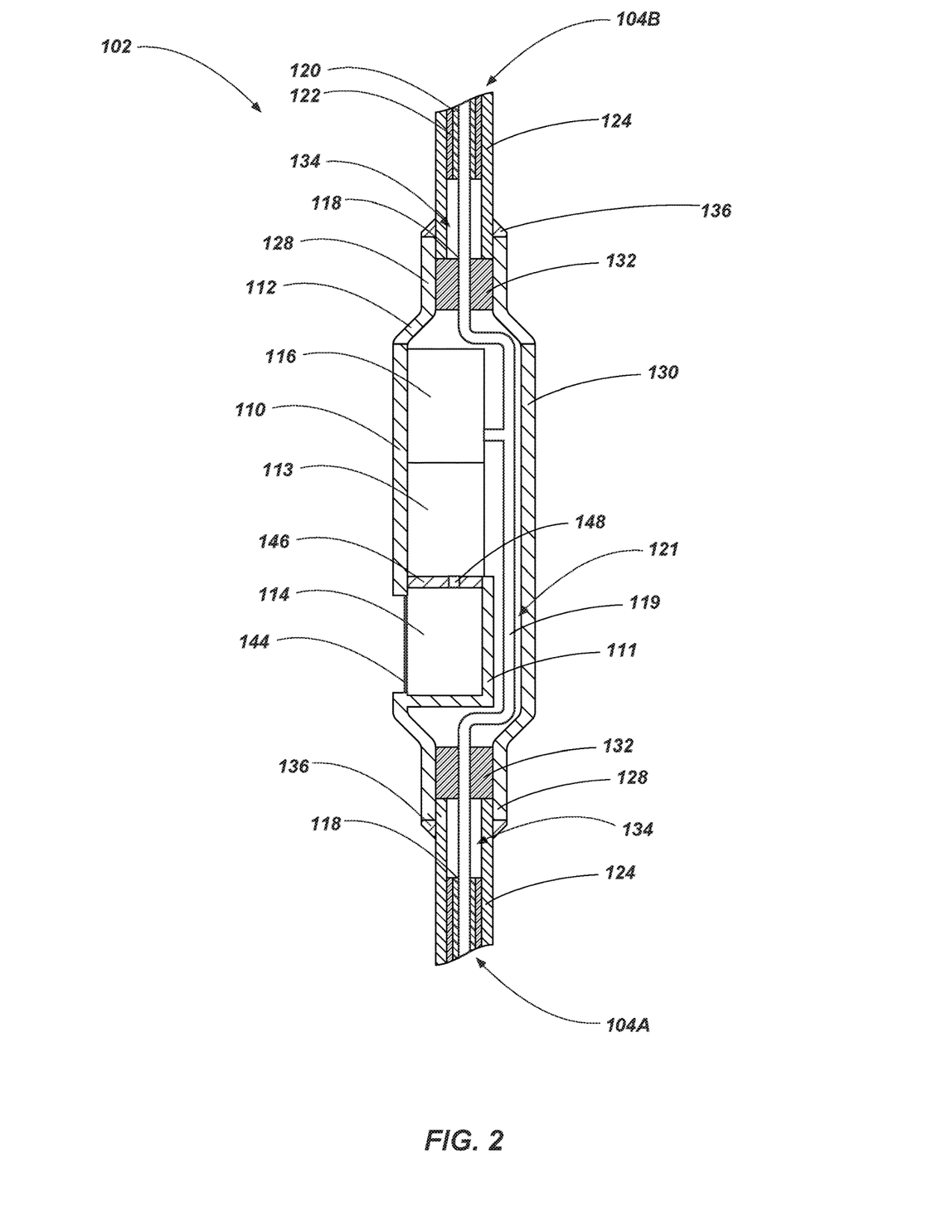
FIG. 2 is a simplified schematic partial cross-sectional view of a sensor of the sensor array of FIG. 1.

Referring now to FIG. 2, a sensor 102 of the sensor array 100 (FIG. 1) may include one or more sensing elements 114 and one or more electronic components 116 configured to distribute power to, receive data from, and otherwise control the function of the one or more sensing elements 114. The one or more sensing elements 114 and the electronic components 116 may be operatively connected to the central electrical conductors 118 within a first cable segment 104A and a second cable segment 104B. As depicted, the central electrical conductors 118 within the first cable segment 104A and the second cable segment 104B may be connected via a conductor 119 running through the sensor 102 (e.g., through a feedthrough portion 121), which conductor 119 is in electrical communication with the sensing elements 114 and the electronic components 116.

In some embodiments, the one or more sensing elements 114 may include, e.g., one or more resonator sensors, such as, for example, resonator sensors implementing one or more thickness shear mode quartz crystal resonators. As a non-limiting example, suitable quartz resonator sensors may include sensors similar or identical to those described in U.S. patent application Ser. No. 14/472,218, filed Aug. 8, 2014, the disclosure of which is herein incorporated in its entirety by this reference, which application describes the use of quartz crystal sensing elements to sense one or more of pressure and temperature. For example, as disclosed in U.S. patent application Ser. No. 14/472,218, such a quartz crystal sensing element may have an outer lateral dimension (e.g., diameter, a dimension extending along a resonating portion of the quartz crystal sensing element) less than about 0.575 inch (14.605 millimeters), about 0.50 inch (12.7 millimeters), 0.40 inch (10.16 millimeters), or lower, such as, for example, 0.375 inch (9.525 millimeters). By way of further example, such a quartz crystal sensing element may have an outer dimension (e.g., diameter) between about 0.30 inch (7.62 millimeters) and about 0.50 inch (12.7 millimeters) or between about 0.30 inch (7.62 millimeters) and about 0.40 inch (10.16 millimeters).

In some embodiments, sensors in accordance with the instant disclosure may include methods of fabrication, orientations, quartz structures, electronics, assemblies, housings, reference sensors, and components similar to the sensors and transducers disclosed in, for example, U.S. Pat. No. 6,131,462 to EerNisse et al., U.S. Pat. No. 5,471,882 to Wiggins, U.S. Pat. No. 5,231,880 to Ward et al., U.S. Pat. No. 4,550,610 to EerNisse et al., and U.S. Pat. No. 3,561,832 to Karrer et al., the disclosure of each of which patents is hereby incorporated herein in its entirety by this reference.

As discussed below, in some embodiments, such a pressure sensor or transducer having a quartz crystal pressure sensor (e.g., such as that described in U.S. Pat. No. 6,131,462 to EerNisse et al.) may also include a quartz crystal reference sensor and a quartz crystal temperature sensor that are utilized in comparing the outputs of the crystal sensors (e.g., via frequency mixing and/or using the reference frequency to count the signals from the other two crystals) for temperature compensation and to prevent drift and other pressure signal output anomalies. In some embodiments, one or more of the sensors (e.g., the temperature sensor) may comprise an electronic sensor. For example, one or more sensors may comprise a silicon temperature sensor using, for example, integrated electronic circuits to monitor temperature rather than a sensor exhibiting temperature-dependent variable mechanical characteristics (e.g., frequency changes of a resonator element) such as a quartz crystal resonator. Such sensor configurations may be similar to those described in U.S. patent application Ser. No. 13/934,058, filed Jul. 2, 2013, the disclosure of which is hereby incorporated herein in its entirety by this reference, which application describes the use of an electronic temperature sensor in a pressure sensor. In additional embodiments, one or more of the sensors may include micro-electro-mechanical devices (MEMS) or other types of suitable electronic sensors.

In yet additional embodiments, the pressure sensors may comprise a dual-mode sensor configured to sense both pressure and temperature, for example, such as those described in U.S. patent application Ser. No. 13/839,238, filed Mar. 15, 2013, the disclosure of which is hereby incorporated herein in its entirety by this reference.

In some embodiments, especially where the sensor 102 is configured as a pressure sensor, the sensing element 114 may be placed in communication with a portion of an environment external to the sensor 102 (e.g., fluid of the external environment) via an isolation element 144 (e.g., a diaphragm assembly, a bladder assembly, a bellows assembly, as well as combinations of the foregoing). For example, the isolation element 144 may act to transmit pressure and/or temperature exterior to the sensor 102 to the sensing element 114 within the sensor 102 (e.g., via a fluid within the sensor 102). As discussed below in greater detail, fluid may be disposed in a chamber around or otherwise adjacent to the sensing element 114 (e.g., formed in a pressure housing 111 of a housing body 110 of the sensor 102) to transmit the pressure and/or temperature of the environment adjacent to the exterior of the sensor 102. In some embodiments, the fluid within the sensor 102 may comprise a highly incompressible, low thermal expansion fluid such as, for example, oil (e.g., a PARATHERM® or sebacate oil). The pressure and thermal expansion of the fluid may be sensed by the sensing element 114 (e.g., a quartz crystal sensing element).

Where the sensing element 114 is placed in communication with a portion of an environment external to the sensor 102, a bulkhead 146 (e.g., cap) may be positioned between the sensing element 114 and another portion of the interior of the sensor 102 (e.g., the electronic components 116) to isolate the portion of the sensor 102 from forces from the exterior environment (e.g., from the fluid within the sensor 102 surrounding the sensing element 114). The bulkhead 146 may include one or more electrical conductors (e.g., feedthrough pins 148) extending through the bulkhead 146 to connect the sensing element 114 to the electronic components 116.

In some embodiments, the sensor 102 may include additional sensing elements 113 (e.g., temperature and/or reference sensors) positioned within the sensor 102 (e.g., isolated by bulkhead 146 from sensing element 114) and coupled to the electronic components 116, as discussed below in further detail.

The conductor 118 of the cable segments 104A, 104B may be surrounded by insulation 120, an encapsulation layer 122, and a jacket 124. The jacket 124 may be formed of a relatively high-strength material (e.g., metal) as compared to the insulation 120 and encapsulation layer 122. The insulation 120 may comprise a high-dielectric polymer material, examples of which may include polytetrafluoroethylene (PTFE) or fluorinated ethylene propylene (FEP). The encapsulation layer 122 may comprise another polymer material, such as polypropylene. The metal jacket 124 may comprise a metal alloy. For example, the metal jacket 124 may comprise 316L stainless steel.

In some embodiments, the conductor 118 may be a single conductor within and extending through the cable segments 104A, 104B. The conductor 118 may serve to transmit power to drive the one or more sensing elements 114 from a power source located on a rig floor of a drilling rig at the surface of the wellbore 106 (FIG. 1) and may also serve to transmit data signals from the one or more sensing elements 114 in each sensor 102 to monitoring equipment located on the rig floor at the surface of the wellbore 106, or remotely. For example, the sensing elements 114 may be connected through the conductors 118 of the cable segments 104A, 104B, by a multiplexing arrangement controlled by the monitoring equipment (not shown) at the surface of the wellbore 106 and/or by the electronic components 116. In other embodiments, the cable segments 104A, 104B may include multiple conductors.

In some embodiments, the one or more electronic components 116 may further be configured to include a bypass mode triggered in the event that a portion of the sensor 102 may be become damaged or malfunction. For example, in the event that an associated one or more sensing elements 114 of the sensor 102 may malfunction or become damaged, the one or more electronic components 116 may be configured to recognize failure of the one or more sensing elements 114 or other portion of the sensor 102 and enter the bypass mode so that the sensor 102 does not inhibit or corrupt data flow from and between remaining functional sensors to the surface of the drilling operation.

The one or more sensing elements 114 and the one or more electronic components 116 may be disposed within a housing including one or more housing portions. For example, a housing of the sensor 102 may include multiple portions to enable installation of the sensing elements 114, the electronic components 116, and other components within the housing. For example, the housing of the sensor 102 may include the housing body 110 and a separate housing end cap 112. The housing body 110 may include one or more features configured to accept a portion of the second cable segment 104B. For example, a sleeve 128 may have an inside diameter substantially similar (e.g., equal to, slightly larger or smaller than) to an outside diameter of the metal jacket 124 of the cable segments 104A, 104B and smaller than an inside diameter of the housing body 110 in order to receive a portion of the metal jacket 124 of the cable segment 104B in the sleeve 128. The housing body 110 may also include a second, open end 130 configured to interface with a portion of the housing end cap 112. The housing end cap 112 may also include a sleeve 128 having an inside diameter substantially similar to the outside diameter of the metal jacket 124 of the cable segment 104A in order to receive a portion of the metal jacket 124 of the cable segment 104A in the housing end cap 112.

The conductors 118 of the cable segments 104A, 104B may be supported and centralized within the housing body 110 by support spacers 132 disposed within the sleeves 128 of the main housing body 110 and the housing end cap 112 proximate end portions of the cable segments 104A, 104B. The support spacers 132 may comprise an electrically insulating material, such as a polymer material (e.g., polypropylene, polytetrafluoroethylene (PTFE), polyethylene terephthalate (PET), polyether ether ketone (PEEK), etc.), and may electrically insulate the central conductor 118 from the housing end cap 112. The support spacers 132 may abut an end of the metal jacket 124 of the cable segments 104A, 104B, and may be of an outer diameter substantially the same as an inner diameter of sleeves 128, or slightly larger than the inner diameter when in an uncompressed state.

At least a portion of the cable segments 104A, 104B may be at least partially (e.g., entirely) free of one or both of the insulation 120 and encapsulation material 122. For example, one or both of the insulation 120 and encapsulation material 122 may be removed from between the metal jacket 124 and the conductor 118 proximate ends of the cable segments 104A, 104B disposed within sleeves 128 of the housing body 110 and housing end cap 112. In other words, a void 134, such as a substantially annular void, may exist between the conductor 118 and the metal jacket 124 near (e.g., proximate, at) the sleeves 128 of the housing body 110 and housing end cap 112 when the cable segments 104A, 104B are disposed within the housing body 110 and housing end cap 112. For example, the conductors 118 of the cable segments 104A, 104B are exposed proximate a union between the cable segments 104A, 104B and the end cap 112 and housing body 110, respectively.

The sensors 102 and cable segments 104A, 104B are joined to form the sensor array 100 (FIG. 1). For example, the sensors 102 may be connected to the cable segments 104A, 104B by bonding (e.g., welding) the sleeves 128 of the housing body 110 and the housing end cap 112 to the metal jacket 124 of the cable segments 104A, 104B. For example, the sleeves 128 and the metal jacket 124 may be welded together at a circumferentially extending weld bead 136, which may also characterized herein as a "weld joint." The weld bead or joint 136 may be located on the jacket 124 proximate the portion of the cable segments 104A, 104B from which the insulation 120 and encapsulation material 122 have been removed.

The connection (e.g., weld bead 136) between the sensors 102 and the cable segments 104A, 104B may be required to be robust enough to withstand the downhole conditions without permitting contamination of or damage to the one or more sensor elements 114 and electronic components 116 as the sensor array 100 (FIG. 1) may be subjected to high pressures and/or temperatures in the downhole environment. However, high temperatures associated with metal welding processes may damage the insulation 120 and encapsulation material 122. For example, the insulation 120 and encapsulation material 122 may melt, char, or otherwise degrade when exposed to the high heat inherent to a metal welding process. Furthermore, degradation of the insulation 120 and encapsulation material 122 may release vapors that could potentially contaminate and compromise the weld bead 136. Thus, removal of the insulation 120 and encapsulation material 122 from the cable 104 creating voids 134 near the weld bead 136 may prevent contamination of the weld bead 136 or damage to the conductor 118, as well as to insulation material 120 and encapsulation material 122 adjacent the weld bead 136.

Figure 3:
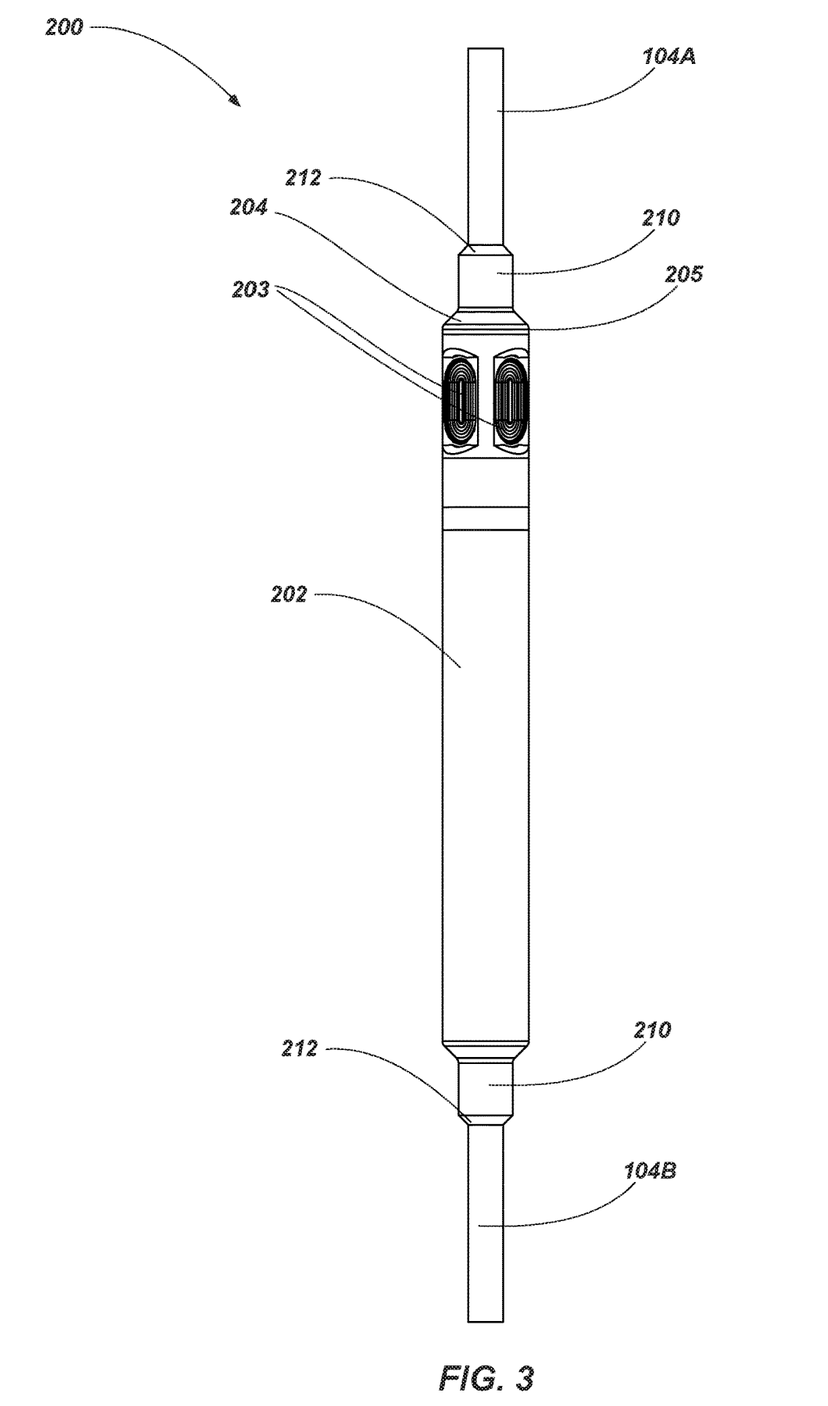
FIG. 3 is a front view of a sensor in accordance with an embodiment of the present disclosure that may be utilized in a sensor array (e.g., the sensor array shown in FIG. 1)

Referring now to FIG. 3, an embodiment of a sensor 200 (e.g., a pressure sensor 200, which may also optionally monitor temperature as discussed below) for use in a sensor array 100 (FIG. 1) is shown. In some embodiments, the sensor 200 may be similar to and include the same or similar features of the sensor 102 shown and described above with reference to FIGS. 1 and 2. As shown in FIG. 3, the sensor 200 includes a housing body 202, a housing end cap 204, a first cable segment 104A, and a second cable segment 104B. As above, each cable segment 104A, 104B may include the insulation 120, the encapsulation material 122, and the metal jacket 124 surrounding the conductor 118 as shown in and described with reference to FIG. 2. Further, the insulation 120 and the encapsulation material 122 may be removed from a portion of the each cable segment 104A, 104B to form void 134 (e.g., substantially annular void) as also shown in and described with reference to FIG. 2.

The housing body 202 and the housing end cap 204 may be coupled (e.g., bonded) to one another circumferentially at a joint 205. For example, the housing body 202 and the housing end cap 204 may be bonded together at joint 205 by a welding process, e.g., an electron-beam welding process. An electron-beam welding process may enable the housing body 202 and the housing end cap 204 to be welded to one another without exposing the internal components of the sensor 200 and cable segments 104A, 104B to excessive heat. Other suitable welding processes may include gas tungsten arc welding (TIG), gas metal arc welding (MIG), flux-shielded arc welding, oxygen-acetylene torch welding, laser beam welding, etc. In other embodiments, the housing body 202 and the housing end cap 204 may be coupled by other features, such as, for example, threads.

The housing body 202 and the housing end cap 204 each include a sleeve 210 into which the first cable segment 104A and the second cable segment 104B may be inserted. The first cable segment 104A and the second cable segment 104B may be bonded to the sleeves 210 as described above. For example, the first cable segment 104A and the second cable segment 104B may be bonded (e.g., sealed) to the sleeves 210 at weld beads 212. The weld beads 212 may be formed by, e.g., TIG welding or other welding processes. The first and second cable segments 104A, 104B may connect the sensor 200 with other sensors to form an array of sensors (see, e.g., sensor array 100 (FIG. 1)).

As depicted, the housing body 202 may include one or more isolation elements 203 disposed on an exterior portion (e.g., wall, outer surface) of the housing body 202 (e.g., extending through a sidewall of the housing body 202) that are also in communication with an interior portion of the housing body 202 (e.g., with a chamber holding a sensing element as detailed below). For example, the housing body 202 may include two isolation elements 203 positioned on an exterior portion (e.g., a circumference) of the housing body 202. In some embodiments, the isolation elements 203 may be diaphragms (e.g., oval diaphragms) such as those described in, for example, U.S. Pat. No. 8,333,117, to Brown et al., the disclosure of which is hereby incorporated herein in its entirety by this reference.

In some embodiments, each isolation element 203 may be in communication with differing portions of the downhole assembly to separately monitor the environmental conditions in the different portions. For example, one isolation element 203 may be in communication with an environment within a string (e.g., a production string) positioned in a wellbore and another isolation element 203 may be in communication with an environment in an annulus between the string in the wellbore and the wellbore itself.

Figure 4:
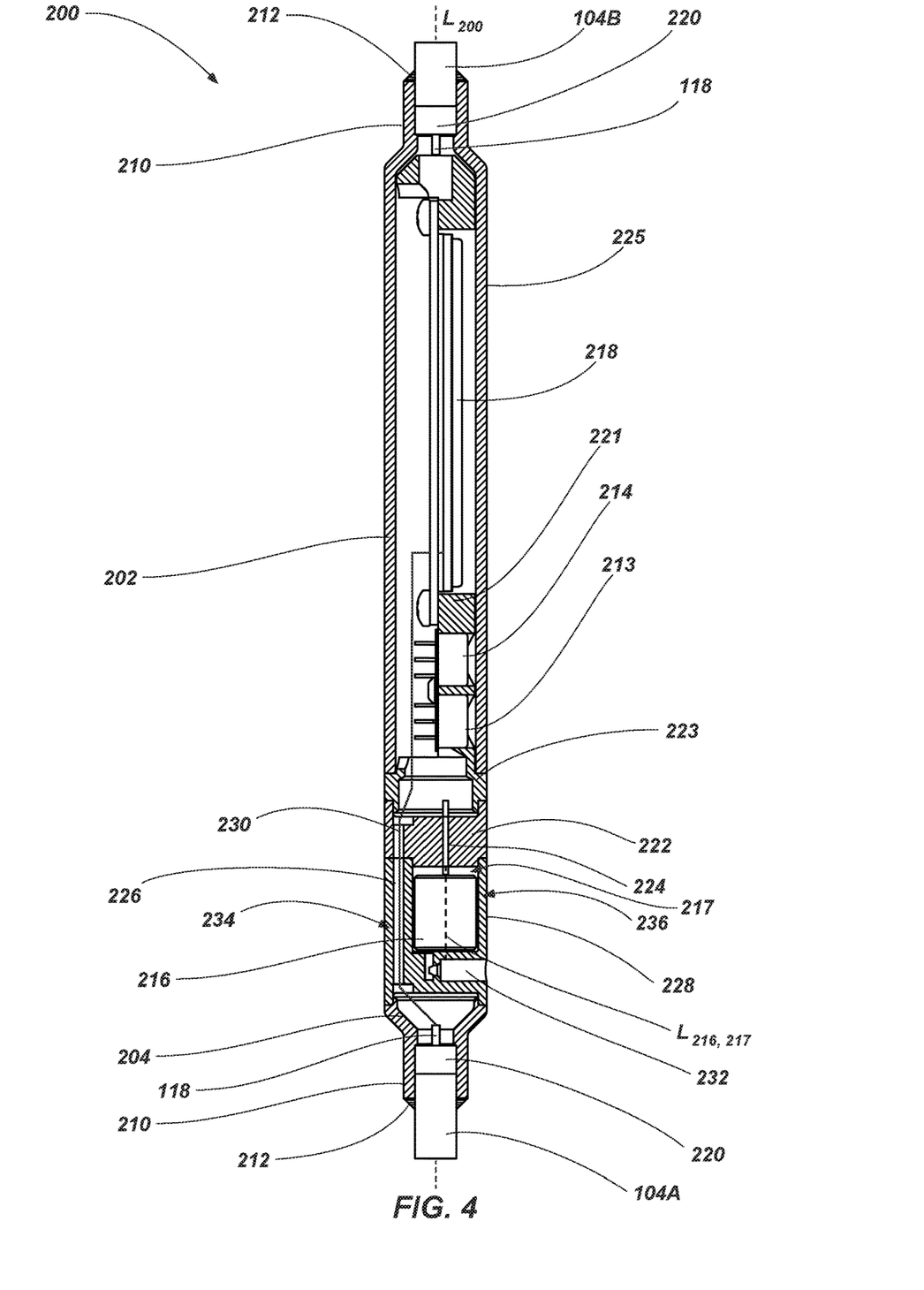
FIG. 4 is a partial cross-sectional view of the sensor of FIG. 3.

FIG. 4 shows a cross-sectional view of the embodiment of the sensor 200 shown in FIG. 3. As described above, the sensor 200 includes a housing body 202, a housing end cap 204, and first and second cable segments 104A, 104B disposed partially within and bonded to (e.g., welded to) sleeves 210 of the housing body 202 and housing end cap 204 at weld joints 212. The sensor 200 may include one or more sensing elements (e.g., quartz crystal resonators) connected to one or more electronic components. For example, the sensor 200 may include a temperature-sensing element 213, a reference element 214, and a pressure-sensing element 216. The temperature-sensing element 213 and the pressure-sensing element 216 may be utilized to measure conditions in an ambient environment within the wellbore 106 (FIG. 1) by at least partially exposing the temperature-sensing element 213 and the pressure-sensing element 216 to the ambient environment. For example, the pressure-sensing element 216 may be disposed in a chamber 217 filed with a fluid (e.g., via fill port 232). The pressure-sensing element 216 and the fluid in the chamber 217 may be in communication with an external pressure in the external environment via the isolation elements 203 (FIG. 3) that are positioned on the exterior of the housing body 202. In some embodiments, the chamber 217 may extend through a sidewall of the housing body 202 (e.g., in a direction transverse (e.g., perpendicular) to a longitudinal axis $L_{200}$ of the sensor 200). In such an embodiment, the isolation elements 203 (FIG. 3) may be positioned over (e.g., directly over) the chamber 217 and the pressure-sensing element 216 in the direction transverse to the longitudinal axis $L_{200}$ of the sensor 200 and in direct communication with the fluid in the chamber 217. The temperature-sensing element 213 may be in communication with an external temperature in the external environment by thermal transmission through the housing body 202, through a fluid within the housing body 202, or combinations thereof.

Each of the temperature-sensing element 213, the reference element 214, and the pressure-sensing element 216 may be operatively connected to an electronics assembly 218 by electrical interconnects (not shown), as is conventional. Additional interconnects (not shown) may operatively connect conductors 118 of the first and second cable segments 104A, 104B to the electronics assembly 218. The electronics assembly 218 may include a power source (e.g., a high-frequency power source) configured to drive one or more of the temperature-sensing element 213, the reference element 214, and the pressure-sensing element 216. As known in the art, temperature-induced and pressure-induced frequency changes in the temperature-sensing element 213 and the pressure-sensing element 216 may be detected by monitoring variations in frequency of the temperature-sensing element 213 and the pressure-sensing element 216 with respect to a frequency of the reference element 214. Data relating to frequency differences between the temperature-sensing element 213 and the reference element 214 and the pressure-sensing element 216 and the reference element 214 may be manipulated by the electronics assembly 218 or by electrical equipment at the surface of the wellbore 106 (FIG. 1) to provide pressure and/or temperature data to an operator.

The sensor 200 may include bulkhead 222 (e.g., a cap) positioned between the pressure-sensing element 216 and the temperature-sensing element 213, the reference element 214, and the electronics assembly 218 to isolate the elements 213, 214, 216 from forces from the exterior environment (e.g., from the fluid within the chamber 217 surrounding the pressure-sensing element 216). The bulkhead 222 may include one or more electrical conductors (e.g., feedthrough pins 224) extending through the bulkhead 222 to connect the pressure-sensing element 216 to the electronics assembly 218.

In some embodiments, the bulkhead 222 may be coupled to (e.g., welded, by utilizing any of the welding techniques discussed above, threaded, etc.) a portion of the housing body 202 (e.g., a cap 223 coupled to an electronics housing portion 225 of the housing body 202). The cap 223 may include an electronics support structure 221 coupled to and extending form the cap 223. The electronics support structure 221 may be configured to accept at least a portion of the reference element 214, at least a portion of the temperature-sensing element 213, and/or at least a portion of the electronics assembly 218 to facilitate assembly of the sensor 200 by enabling a first portion of the sensor 200 (e.g., the cap 223 and the support structure 221) to be inserted into another portion of the sensor 200 (e.g., the electronics housing portion 225 of the housing body 202), as described in further detail below. The cap 223 may be coupled to (e.g., welded, by utilizing any of the welding techniques discussed above, threaded, etc.) to a portion of the housing body 202 (e.g., the electronics housing portion 225).

At least a portion of the housing body 202 of the sensor 200 may comprise a feedthrough portion including one or more feedthrough apertures 226 extending through a portion of the housing body 202 (e.g., the pressure housing 228). In some embodiments, the feedthrough portion and/or the positioning of the chamber 217 and pressure-sensing element 216 in the housing body 202 may be similar to the feedthrough and pass-through configurations described in U.S. Provisional Patent Application No. 62/074,517, to Brown et al., filed on Nov. 3, 2014, now U.S. patent application Ser. No. 14/924,033 to Brown et al., filed Oct. 27, 2015, the disclosure of each of which is herein incorporated in its entirety by this reference. For example, the feedthrough aperture 226 may extend along the longitudinal axis $L_{200}$ of the sensor 200 through a portion of the housing body 202 (e.g., the pressure housing 228 and the bulkhead 222) at least partially exposed to an external environment (e.g., an external pressure). As above, the feedthrough aperture 226 may be used to pass a conductor (e.g., one or more electrical conductors 230) from another component of the sensor 200 (e.g., conductor 118) or from a component external to the sensor 200 along the longitudinal axis $L_{200}$ of the sensor 200, past and along the pressure-sensing element 216, the chamber 217 of the pressure housing 202, and the bulkhead 222, and to the electronics assembly 218 in the electronics housing portion 225 of the housing body 202. Such a configuration may enable one or more conductors 230 to be passed along the longitudinal axis $L_{200}$ of the sensor 200 while being at least partially isolated from the portions of the sensor 200 exposed to the external environment (e.g., the pressure-sensing element 216 and the chamber 217 of the pressure housing 202).

As depicted in FIG. 4, the pressure-sensing element 216 may be positioned along the longitudinal axis $L_{200}$ of the sensor 200. However, one or more of the pressure-sensing element 216 and the chamber 217 may be partially offset (from the longitudinal axis $L_{200}$ of the sensor 200. For example, a longitudinal axis L216 (e.g., a centerline) of the pressure-sensing element 216 and/or a longitudinal axis L217 (e.g., a centerline) of the chamber 217 may be laterally offset from the longitudinal axis $L_{200}$ (e.g., centerline) of the sensor 200 (e.g., in a direction transverse to, e.g., perpendicular to, the longitudinal axis L200). In some embodiments, the longitudinal axis L216 of the pressure-sensing element 216 and the longitudinal axis L217 of the chamber 217 may be coextensive or at least partially coincide (e.g., entirely coincide). In some embodiments, one or more of the pressure-sensing element 216, the chamber 217, and the sensor 200 may have a substantially elliptical (e.g., an ellipse) or circular (e.g., circular, annular, cylindrical) shape and/or cross section and one or more of the pressure-sensing element 216 and the chamber 217 may have a centerline that is laterally offset from a centerline of the sensor 200.

In order to accommodate the feedthrough aperture 226 extending through the housing body 210, one or more portions of the housing body 210 (e.g., the pressure housing 228) may include a first wall portion 234 (e.g., a thick or enlarged walled portion) having a first dimension (e.g., width, thickness, taken in a direction transverse (e.g., perpendicular) to the longitudinal axis $L_{200}$ of the sensor 200) that is greater than a second dimension (e.g., width, thickness, taken in a direction transverse (e.g., perpendicular) to the longitudinal axis $L_{200}$ of the sensor 200) of a second adjacent (e.g., opposing) wall portion 236 (e.g., a thin or normal walled portion) of the housing body 210. For example, the first wall portion 234 and the second wall portion 236 may be positioned about the chamber 217 (e.g., at opposing sides of the chamber 217) where the walls of the pressure housing 228 extending between the first wall portion 234 and the second wall portion 236 taper between the thicknesses of the first wall portion 234 and the second wall portion 236. As discussed below in greater detail, such varying wall thicknesses may allow the pressure housing 228 to accommodate the feedthrough aperture 226 on one side of the pressure housing 228 while still providing a minimum wall thickness surrounding the chamber 217 that can withstand the external forces applied to the pressure housing 228 (e.g., via the fluid in the chamber 217) and/or enable the required connection to (e.g., weld to) another portion of the housing body 210 (e.g., the bulkhead 222).

Figure 5:
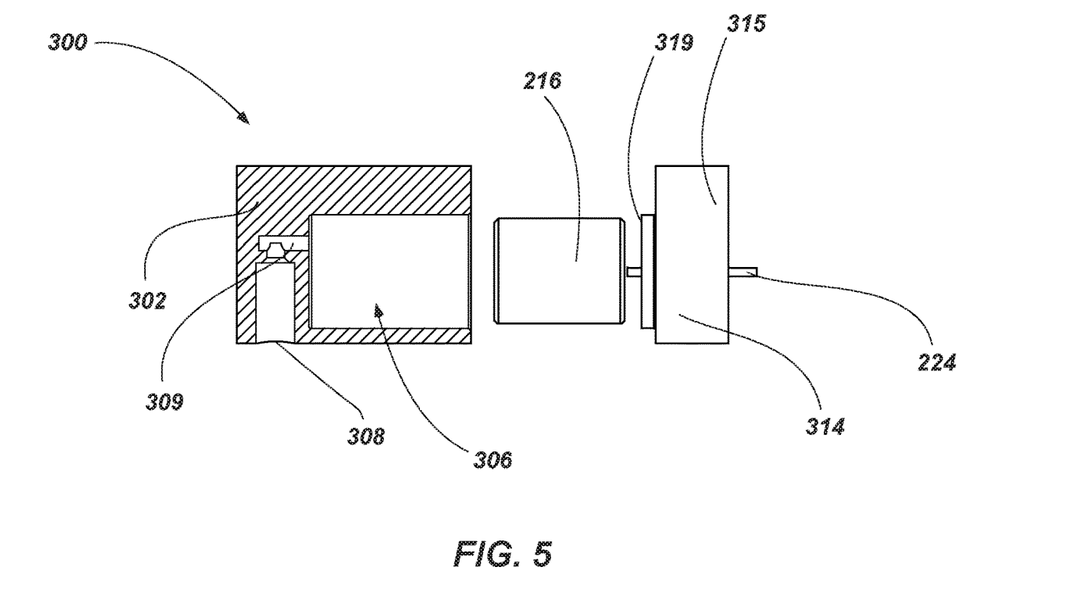
FIG. 5 is an exploded, partial cross-sectional simplified schematic view of a sensor assembly in accordance with an embodiment of the present disclosure.

FIG. 5 is an exploded, partial cross-sectional view of a sensor assembly (e.g., pressure sensor 300) that may be similar to at least of portion (e.g., a pressure housing) of the sensors 102, 200 discussed above in relation to FIGS. 2 through 4. As shown in FIG. 5, the pressure sensor 300 may include a pressure housing 302 and one or more pressure-sensing elements 216 disposed in a chamber 306 in the pressure housing 302 that are exposed to the pressure and/or the temperature of an exterior environment. The pressure sensor 300 may include a cap (e.g., spacer 314 including a flange portion 315) that may be at least partially received in the chamber 306 and one or more feedthrough pins 224 extending through the spacer 314. The chamber 306 of the pressure housing 302 may be in fluid communication with one or more isolation elements 308 (e.g., a diaphragm assembly, a bladder assembly, a bellows assembly, as well as combinations of the foregoing) via channel 309.

Figure 6:
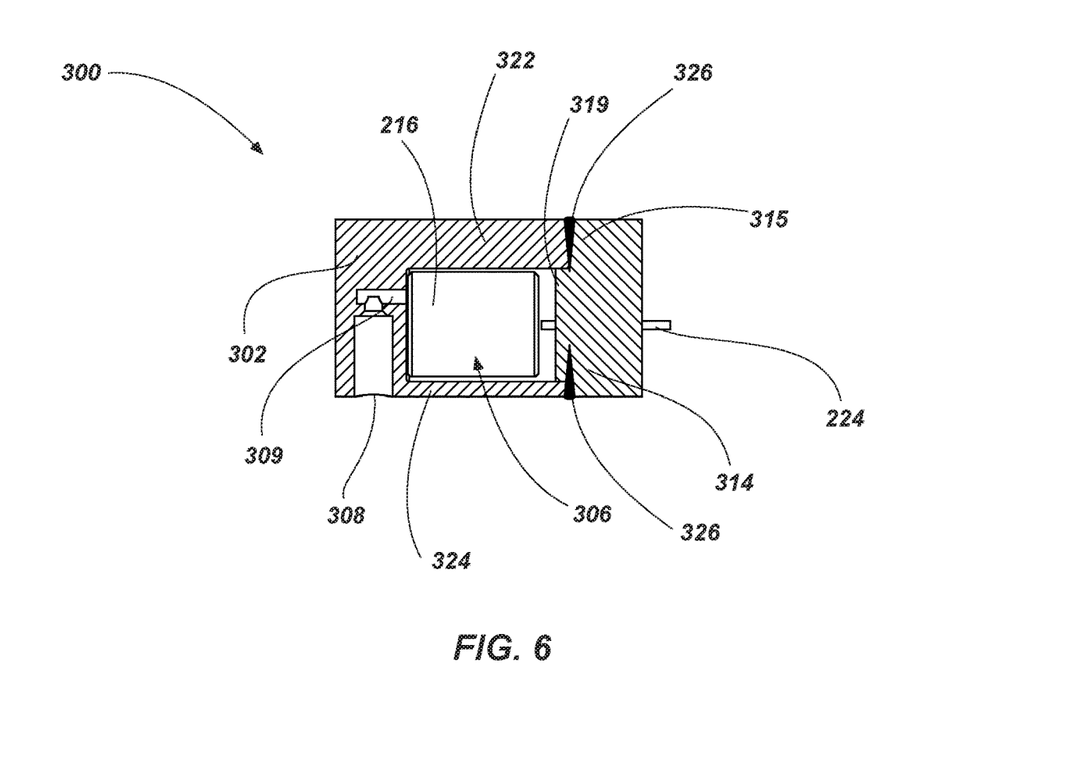
FIG. 6 is a partial cross-sectional simplified schematic view of the sensor assembly of FIG. 5 shown during assembly of the sensor assembly.

FIG. 6 is a partial cross-sectional view of the sensor assembly 300 of FIG. 5 shown during assembly of the pressure sensor 300. As shown in FIG. 6, the pressure-sensing element 216 is received the chamber 306 in the pressure housing 302. Spacer 314 is attached to the pressure housing 302 at at least the flange portion 315 surrounding a protrusion 319 of the spacer 314 that is received in the chamber 306. For example, spacer 314 is welded to the pressure housing 302 (e.g., along the flange portion 315) to at least partially (e.g., entirely) seal the pressure-sensing element 216 within the chamber 306. Weld 326 (e.g., weld bead) may be disposed about the sensor 200 at an interface between the spacer 314 and the pressure housing 302. In embodiments where a welded joint is implemented, the welding process may comprise one or more of a gas metal arc welding process (MIG), a gas tungsten arc welding process (TIG), other types of fusion welding process (e.g., an electron-beam welding process (EBW), laser beam welding), and other types of welding.

As depicted, the depth or thickness of the weld 326 may be selected to be larger than is required by the environmental conditions (e.g., pressure and/or temperature) in which the pressure sensor 300 is designed to operate. In other words, the depth or thickness of the weld 326 may be selected to extend a distance greater than the depth or thickness that is required by the maximum pressure and/or temperature in which the pressure sensor 300 is designed to operate. For example, the depth or thickness of the weld 326 may be selected to extend a distance substantially equal to or greater than a thickness (e.g., diameter) of one or more apertures in the pressure housing 302 (e.g., aperture 318 (FIG. 7)). In some embodiments, the depth or thickness of the weld 326 may be selected to extend a distance substantially equal to or greater than the thickness of a first wall portion 322 (e.g., a thick walled portion) of the pressure housing 302 and to substantially exceed the thickness of a second adjacent wall portion 324 (e.g., a thin walled portion) of the pressure housing 302. In some embodiments, the depth or thickness of the weld 326 may be selected to extend a distance substantially equal to or greater than the thickness of a second adjacent wall portion 324 (e.g., a thin walled portion) of the pressure housing 302 plus a thickness of an aperture (e.g., aperture 318, discussed below) formed in the first wall portion 322.

Figure 7:
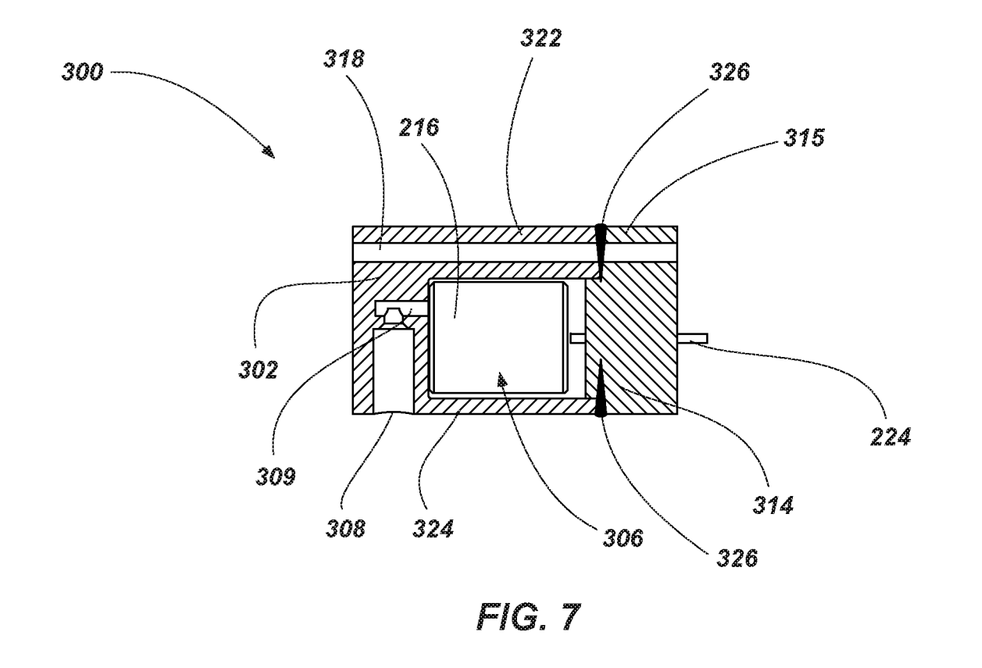
FIG. 7 is a partial cross-sectional simplified schematic view of the sensor assembly of FIGS. 5 and 6 shown during assembly of the sensor assembly.

FIG. 7 is another partial cross-sectional view of the pressure sensor 300 of FIGS. 5 and 6 shown during assembly of the pressure sensor 300. As shown in FIG. 7, after the spacer 314 is welded to the pressure housing 302, one or more apertures 318 may be formed (e.g., machined by drilling, milling, etc.) in and extend along the pressure sensor 300 (e.g., along and through the pressure housing 302, the spacer 314, and a portion of the weld 326 between the spacer 314 and the pressure housing 302). As discussed above, such one or more apertures 318 may be utilized to pass conductors (e.g., electrical conductors past the pressure housing 302).

Referring now to FIGS. 2 through 4, a sensor 200 may be assembled with cable segments 104A, 104B in the following manner. Sensor components and electronic components (e.g., the temperature-sensing element 213, the reference element 214, the pressure-sensing element 216, and the electronics assembly 218) may be assembled with the electronics support structure 221. Electrical interconnects may be connected between the temperature-sensing element 213, the reference element 214, the pressure-sensing element 216, and the electronics assembly 218.

The electronics support structure 221 that is coupled to cap 223 may be further coupled to bulkhead 222 (e.g., via welding or other suitable connection, such as threading). The bulkhead 222 may be connected to the remainder of the pressure housing 228 by, for example, a welding process such as that discussed above.

As discussed above, the insulation 120 and encapsulation layer 122 may be removed from ends of the cable segments 104A, 104B. In some embodiments, the insulation 120 and encapsulation layer 122 may be removed by machining, for example, with a hollow end mill (not shown) having a central opening configured to fit over the conductor 118 and an outer diameter sized to fit within the inside of the metal jacket 124. The cable segments 104A, 104B may be mounted in a tooling device (e.g., a jig or vise) of a milling machine and the hollow end mill may be used to remove a portion of the insulation 120 and the encapsulation material 122 from between the conductor 118 and the metal jacket 124 to create a substantially annular void 134. In some embodiments, the insulation 120 and encapsulation material 122 may alternatively or additionally be removed by exposing the insulation 120 and encapsulation material 122 to a solvent.

Removing the insulation 120 and encapsulation material 122 to leave the void 134 may prevent contamination of the weld bead 212, degradation of the insulation 120 and encapsulation material 122, and damage to the sensor components (e.g., the temperature-sensing element 213, the reference element 214, the pressure-sensing element 216, and the electronics assembly 218) resulting from degradation of the insulation 120 and encapsulation material 122 during the welding process. Further, the void about the conductor 118 may act to at least partially isolate the conductor 118 from the heat of the welding process. In some embodiments, a support spacer 220 may protect the above-listed sensor components by impeding (e.g., slowing) heat transfer between the volume of void 134 and an interior of the housing body 202 within which the temperature-sensing element 213, the reference element 214, the pressure-sensing element 216, and the electronics assembly 218 are disposed.

The first cable segment 104A may be inserted within the sleeve 210 of the housing end cap 204. The support spacer 220 may be disposed within the sleeve 210 of the housing end cap 204 and serve to centralize the conductor 118 within the housing end cap 204 and electrically insulate the conductor 118 from the housing end cap 204. In some embodiments, the support spacer 220 may be positioned to abut the end 226 of the metal jacket 124 of the first cable segment 104A.

The metal jacket 124 of the first cable segment 104A may be welded to the sleeve 210 of the housing end cap 204 using any of the welding methods described above. Before or after welding the metal jacket 124 of the first cable segment 104A to the sleeve 210 of the housing end cap 204, the conductor 118 may be connected to the electronics assembly 218 by the conductor 230. The housing end cap 204 may be coupled to the pressure housing 228 by any of the welding methods described above, or other methods, such as, for example, a threaded connection.

The temperature-sensing element 213, the reference element 214, and the electronics assembly 218 attached to the electronics support structure 221 may be inserted into another portion of the housing body 202 (e.g., the electronics housing portion 225) with the cap 223 (and, optionally, the pressure housing 228, if attached to the cap 223 previously) until the cap 223 mates with the electronics housing portion 225. The cap 223 may be coupled to the electronics housing portion 225 by any of the welding methods described above or other methods, such as, for example, a threaded connection.

The second cable segment 104B may be connected to the electronics assembly 218 and inserted into the sleeve 210 of the housing body 202 and the conductor 118 of the second cable segment 104B. For example, an interconnect (not shown) may be connected to the conductor 118 prior to the second cable segment 104B being inserted into the sleeve 210. In other embodiments, the housing body 202 and/or the electronics assembly 218 may include electrical terminals (not shown) configured to contact the conductor 118 when the second cable segment 104B is inserted into the sleeve 210 of the housing body 202. The metal jacket 124 of the second cable segment 104B may be welded to the sleeve 210 of the housing body 202 by any of the methods described above.

The present disclosure provides embodiments of a sensor array (e.g., a pressure sensor array) for downhole use utilizing electrical interconnecting cables between individual sensors of the sensor array. As discussed above, conventional downhole sensor systems feature fiber optic data interconnects between sensor devices. Fiber optical interconnects may have significant disadvantages as compared to the electrical interconnects disclosed herein. For example, optical fibers are sensitive to geometry and alignment and may fail to accurately transmit data if the optical fiber is bent (e.g., kinked) to a radius of curvature smaller than a certain value. Furthermore, optical fibers may be fragile and prone to failure under conditions of shock and vibration frequently encountered in a downhole environment. In contrast, the use of electrical conductors and electronically driven sensors as disclosed herein may provide a robust and reliable connection between sensors of the sensor array as a more robust and/or less expensive and fragile alternative to the use of fiber optics. Moreover, welding the metal jacket of the cable segments to the housing body and the housing end cap may provide a bond and seal between the cable segments and the sensor capable of withstanding the elevated temperatures and extreme pressures to which the sensor array may be subjected during use. Finally, the configuration of the housing body and the housing end cap may enable the welding processes described herein to be performed without damaging sensitive components (e.g., the one or more sensing elements and the one or more electrical components) within the housing and the cable housing connecting the housings.

Furthermore, embodiments of the present disclosure may be particularly useful in providing sensors (e.g., pressure sensors) and arrays of such sensors that are at least partially exposed to the exterior environment and still enable the passage of conductors from one component of the sensor or between multiple sensors or other components through (e.g., within) the housing of the sensor. Conventionally, such conductors are required to be passed around one or more portions of a housing of the sensor (i.e., external to the housing of the sensor) that is exposed to the exterior environment (e.g., a pressure housing) due to the structural and/or sealing constraints imposed by such sensors. As will be appreciated, such sensors including external conductors generally are required to have relatively larger diameters or cross-sectional areas than sensors in accordance with the instant disclosure that enable the ability to pass conductors through an internal feedthrough of the sensor. In downhole applications, such a feedthrough portion in a sensor housing may enable the overall size of a sensor assembly to be reduced, enabling other components of a downhole tool to utilize the space and/or enabling more efficient production of current, smaller wellbore diameter wells as well as exploration of new, more challenging formations using so-called "slimhole" drilling techniques with small diameter drilling strings and bottomhole components. For example, relatively smaller sensors also enable the ability to pass wires past the sensor between components above and below such sensors when disposed in a drill string in ways that were not possible before with conventional sized sensors.

While the disclosure may be susceptible to various modifications and alternative forms, specific embodiments have been shown by way of example in the drawings and have been described in detail herein. However, it should be understood that the disclosure is not intended to be limited to the particular forms disclosed. Rather, the disclosure encompasses all modifications, variations, combinations, and alternatives falling within the scope of the disclosure as defined by the following appended claims and their legal equivalents.

What is claimed is:

1. A downhole distributed quartz pressure sensor array, comprising:
    sensor housings, at least some of the sensor housings each comprising at least one quartz pressure sensor disposed in a sealed pressure housing for detecting a pressure of an environment external to the sealed pressure housing;
    cable segments connecting the sensor housings; and
    at least one electrical conductor extending through the cable segments and connecting a sensor housing of the sensor housings to an adjacent sensor housing of the sensor housings, wherein a portion of the at least one electrical conductor passes internally through at least one of the cable segments and internally within the sensor housing around the pressure housing of the sensor housing.

2. The downhole distributed quartz pressure sensor array of claim 1, wherein the at least one electrical conductor comprises electrical conductors, wherein the sensor housing further comprises an electronics assembly, and wherein the at least one electrical conductor is electronically coupled to the electronics assembly and extends from a first electrical conductor of the electrical conductors at a first end of the sensor housing through the pressure housing and past the at least one quartz pressure sensor to a second electrical conductor of the electrical conductors at a second end of the sensor housing opposing the first end.

3. The downhole distributed quartz pressure sensor array of claim 1, wherein the at least one electrical conductor extends through one of the cable segments and into an internal portion the sensor housing where the at least one electrical conductor circumvents at least one chamber of the housings.

4. The downhole distributed quartz pressure sensor array of claim 1, wherein the at least one electrical conductor connecting adjacent sensor housings and passing around at least one chamber of the respective housing are each entirely internal to the pressure sensor array.

5. The downhole distributed quartz pressure sensor array of claim 1, wherein the sensor housing further comprises at least one chamber in the pressure housing holding the at least one quartz pressure sensor, the at least one chamber in communication with an environment exterior to the sensor housing and containing a substantially incompressible fluid.

6. The downhole distributed quartz pressure sensor array of claim 5, wherein the sensor housing further comprises at least one diaphragm positioned between an interior portion of the sensor housing and the environment exterior to the sensor housing, the at least one diaphragm being in communication with the at least one chamber.

7. The downhole distributed quartz pressure sensor array of claim 1, wherein at least one electrical conductor extends along a longitudinal axis of the sensor housing within the sensor housing and along the pressure housing.

8. The downhole distributed quartz pressure sensor array of claim 7, wherein the sensor housing further comprises an electronics assembly disposed in an electronics housing portion, and wherein the at least one electrical conductor is electronically coupled to the electronics assembly and extends past the at least one quartz pressure sensor to the electronics assembly.

9. A downhole distributed pressure sensor array, comprising:
    sensor housings, each sensor housing having a longitudinal axis and comprising:
        at least one pressure sensor comprising a quartz resonator;
        at least one chamber in the sensor housing holding a substantially incompressible fluid and in communication with the at least one pressure sensor, the at least one chamber in communication with an environment exterior to the sensor housing; and
        at least one isolation element coupled to the sensor housing in communication with the chamber; and
    electrical conductors extending through cable segments between adjacent sensor housings and extending internally within each sensor housing and around the at least one chamber of the respective sensor housing, the electrical conductors connecting each sensor housing of the sensor housings to an adjacent sensor housing.

10. The downhole distributed pressure sensor array of claim 9, wherein the electrical conductors are entirely internal to the pressure sensor array and only extend through the pressure sensor array either through and enclosed within the sensor housings or through and enclosed within the cable segments.

11. The downhole distributed pressure sensor array of claim 9, wherein the electrical conductors extend through the cable segments and into an internal portion of each of the sensor housings where the electrical conductors circumvent a respective at least one chamber of each of the sensor housings.

12. The downhole distributed pressure sensor array of claim 9, wherein the electrical conductors connecting adjacent sensor housings and passing around the at least one chamber of the respective sensor housing are each entirely internal to the pressure sensor array.

13. A downhole pressure sensor array, comprising:
    pressure sensors, each comprising:
        a housing having a longitudinal axis, the housing comprising:
            at least one quartz resonator for detecting a pressure of an environment external to the sensor;
            at least one chamber in a pressure housing portion of the housing holding the at least one quartz resonator and for holding a substantially incompressible fluid, the at least one chamber extending through at least one portion of an outer wall of the housing; and at least one isolation element coupled to the pressure housing portion of the housing in communication with the at least one chamber; and electrical conductors extending through cable segments and connecting each housing of the housing to an adjacent housing, the electrical conductors comprising electrical connections extending between respective cable segments entirely within one housing of a respective pressure sensor.

14. The downhole pressure sensor array of claim 13, wherein the electrical conductors connect adjacent housings by passing around the at least one chamber of the respective housing at a location entirely internal to the pressure sensor array.

15. The downhole pressure sensor array of claim 13, wherein the at least one chamber is configured to place the at least one quartz resonator in communication with the environment external to the sensor via the substantially incompressible fluid.

16. The downhole pressure sensor array of claim 13, wherein the at least one isolation element comprises at least one diaphragm positioned between the housing and the environment external to the housing.

17. The downhole pressure sensor array of claim 13, wherein the electrical conductors extend along the longitudinal axis of each housing within the housing and along the at least one chamber.

18. The downhole pressure sensor array of claim 13, wherein the housing further comprises an electronics assembly disposed in an electronics housing portion, and wherein the electrical conductors are electronically coupled to the electronics assembly and extends past the at least one quartz resonator to the electronics assembly.

19. The downhole pressure sensor array of claim 13, wherein the at least one chamber comprises a substantially incompressible fluid disposed therein.

* * * * *